(12) United States Patent  (10) Patent No.: US 8,094,359 B1
Matsko et al.  (45) Date of Patent: Jan. 10, 2012

(54) ELECTRO-OPTIC WHISPERING-GALLERY-MODE RESONATOR DEVICES

(75) Inventors: Andrey B. Matsko, Pasadena, CA (US);
Anatoliy Savchenkov, Glendale, CA (US); Vladimir Ilchenko, Arcadia, CA (US); Lute Maleki, Pasadena, CA (US); David Seidel, Alta Loma, CA (US); Jerry Byrd, North Hollywood, CA (US)

(73) Assignee: OEwaves, Inc., Pasadena, CA (US)

( * ) Notice: Subject to any disclaimer, the term of this patent is extended or adjusted under 35 U.S.C. 154(b) by 86 days.

(21) Appl. No.: 12/454,382

(22) Filed: May 15, 2009

Related U.S. Application Data (60) Provisional application No. 61/053,404, filed on May 15, 2008, provisional application No. 61/114,146, filed on Nov. 13, 2008.

(51) Int. Cl.
G02B 26/00 (2006.01)
G02B 6/10 (2006.01)
G02F 1/03 (2006.01)
H01S 3/083 (2006.01)

(52) U.S. Cl. ........... 359/239; 359/245; 372/94; 385/146

(58) Field of Classification Search .......... 359/245, 359/239; 372/6, 92, 94, 98, 104, 108; 385/1–3, 385/36, 39–40, 42, 146
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |

(Continued)

FOREIGN PATENT DOCUMENTS

WO 01/96936 12/2001

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Dawayne Pinkney
(74) *Attorney, Agent, or Firm* — Perkins Coie LLP (57) ABSTRACT

Devices and techniques for forming devices based on electro-optic whispering gallery mode (WGM) resonators by using spatially modulated electrodes and electro-optic whispering gallery mode (WGM) resonators that effectuate coupling between light in an optical whispering gallery mode in the TE mode and light in another optical whispering gallery mode in the TM mode.

16 Claims, 8 Drawing Sheets

U.S. PATENT DOCUMENTS

| | | |
|---|---|---|
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2007/0274621 A1* | 11/2007 | Clapp .................. 385/3 |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled LiNbO$_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Technology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

Jau, Y.-Y., et al., "Push-Pull Optical Pumping of Pure Superposition States," Physical Review Letters, 93 (16):160802.1-160802.4, Oct. 2004.

Kargapoltsev, S.V., et al., "High-contrast dark resonance in σ+-σ− optical field," Laser Physics Letters, 1 (10):495-499, Oct. 2004.

Knappe, S., et al., "A chip-scale atomic clock based on 87Rb with improved frequency stability," Optics Express, 13 (4):1249-1253, Feb. 2005.

Matsko, A., et al., "Magnetometer based on the opto-electronic microwave oscillator," Optics Communications, 247 (1-3):141-148, Mar. 2005.

Rosenbluh, M., et al., "Differentially detected coherent population trapping resonances excited by orthogonally polarized laser fields," Optics Express, 14(15):6588-6594, Jul. 2006.

Savchenkov, A., et al., "RF photonic signal processing components: From high order tunable filters to high stability tunable oscillators," IEEE Radar Conference, pp. 1-6, May 2009.

Savchenkov, A., et al., "Tunable optical single-sideband modulator with complete sideband suppression," Optics Letters, 34(9):1300-1302, May 2009.

Savchenkov, A., et al., "Tunable Resonant Single-Sideband Electro-Optical Modulator," Digest of the IEEE/LEOS Summer Topical Meetings, pp. 63-64, Jul. 2009.

Schwindt, P., et al., "Chip-scale atomic magnetometer," Applied Physics Letters, 85(26):6409-6411, Dec. 2004.

Strekalov, D., et al., "Application of vertical cavity surface emitting lasers in self-oscillating atomic clocks," Journal of Modern Optics, 53(16-17):2469-2484, Nov. 2006.

Vanier, J., "Atomic clocks based on coherent population trapping: a review," Applied Physics B, 81(4):421-442, Aug. 2005.

Zanon, T., et al., "High Contrast Ramsey Fringes with Coherent-Population-Trapping Pulses in a Double Lambda Atomic System," Physical Review Letters, 94(19):193002.1-193002.4, May 2005.

\* cited by examiner

200
ELECTRO-OPTIC WHISPERING-GALLERY-MODE RESONATOR DEVICES

This patent document claims the benefits of U.S. Provisional Application No. 61/053,404 entitled "CPW On-Chip Excitation of Receiver" and filed May 15, 2008, and U.S. Provisional Application No. 61/114,146 entitled "WGMR Based Tunable SSB Modulator" and filed Nov. 13, 2008. The disclosures of the above applications are incorporated by reference as part of the disclosure of this document.

BACKGROUND

This document relates to optical resonators and devices using optical resonators.

Optical resonators can be configured in various configurations. Examples of well-known optical resonator designs includes Fabry-Perot optical resonators and optical ring resonators. As another example, an optical material such as a dielectric material may be shaped to construct an optical whispering-gallery-mode ("WGM") resonator which supports one or more resonator modes known as whispering gallery ("WG") modes. These WG modes represent optical fields confined in an interior region close to the surface of the resonator due to the total internal reflection at the boundary. Microspheres with diameters from few tens of microns to several hundreds of microns have been used to form compact optical WGM resonators. Such spherical resonators include at least a portion of the sphere that comprises the equator of the sphere. The resonator dimension is generally much larger than the wavelength of light so that the optical loss due to the finite curvature of the resonators is small. As a result, a high quality factor, Q, e.g., greater than $10^9$, may be achieved in such resonators. Hence, optical energy, once coupled into a whispering gallery mode, can circulate within the WGM resonator with a long photon life time. Such hi-Q WGM resonators may be used in many optical applications, including optical filtering, optical delay, optical sensing, lasers, and opto-electronic oscillators.

SUMMARY

Various implementations are described in greater detail in the attached drawings, the detailed description and the claims.

BRIEF DESCRIPTION OF THE DRAWINGS

FIGS. 1-8 show various features of examples.

DETAILED DESCRIPTION

Many WGM resonators are axially or cylindrically symmetric around a symmetry axis around which the WG modes circulate in a circular path or the equator. The exterior surface of such a resonator is smooth and provides spatial confinement to light around the circular plane to support one or more WG modes. The exterior surface may be curved toward the symmetry axis to spatially confine the light along the symmetry axis. A WGM resonator may be shaped symmetrically around a symmetry axis and has a protruded belt region to form a circular path to confine light in one or more WG modes. The exterior surface of the protruded belt region may be any suitable geometrical shape such as a flat surface or a curved surface. Such a WGM resonator may be configured in any suitable physical size for a given wavelength of light. Various materials can be used for WGM resonators and include, for example, crystal materials and non-crystal materials. Some examples of suitable dielectric materials include fused silica materials, glass materials, lithium niobate materials, and calcium fluoride materials.

A whispering gallery mode resonator can be made of a material exhibiting an electro-optic effect and can include electrodes on the optical resonator to apply an RF or microwave signal to the optical resonator to effectuate the electro-optic effect to control the one or more optical whispering gallery modes circulating along a circular optical loop near a rim of the optical resonator. The electro-optic effect in such a WGM resonator can be used to tune the resonator and to modulate light for a wide range of applications.

Figure 1A:
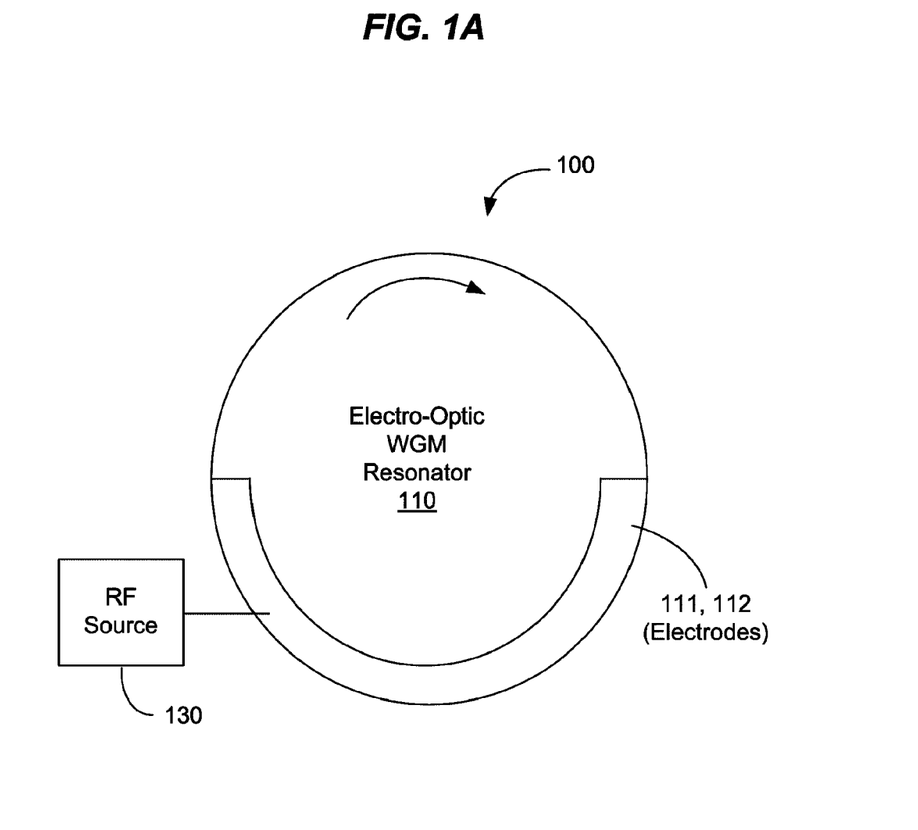
FIGS. 1A and 1B show an example of an electro-optic WGM resonator.
Figure 1B:
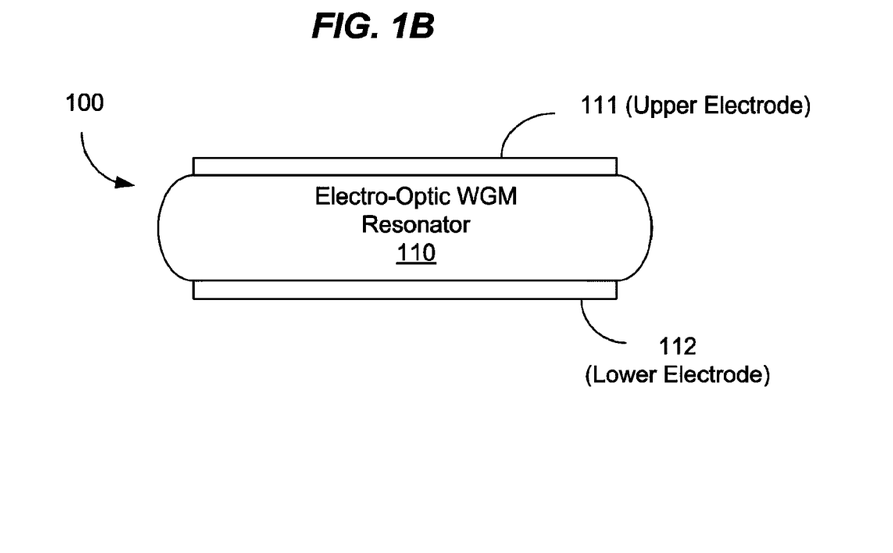

FIGS. 1A and 1B show an example of an electro-optic WGM resonator 100 having a WGM resonator 110. The electro-optic material for the entire or part of the resonator 610 may be any suitable material, including an electro-optic crystal such as Lithium Niobate ("Lithium Niobate resonator") and semiconductor multiple quantum well structures. One or more electrodes 111 and 112 may be formed on the resonator 110 to apply a control electrical field in at least the region where the WG modes are present to control the index of the electro-optical material and to change the filter function of the resonator. Assuming the resonator 110 has disk or ring geometry, the electrode 111 may be formed on the top of the resonator 110 and the electrode 112 may be formed on the bottom of the resonator 110 as illustrated in the side view of the device in FIG. 1B. In one implementation, the electrodes 111 and 112 may constitute an RF or microwave resonator to apply the RF or microwave signal to co-propagate along with the desired optical WG mode. For example, the electrodes 111 and 112 may be microstrip line electrodes. The electrodes 111 and 112 may also form an electrical waveguide to direct the electrical control signal to propagate along the paths of the WG modes. An RF or microwave circuit 130 such as a control circuit may be used to supply the electrical control signal to the electrodes 111 and 112.

In operating the tunable resonator 100, the control unit 130 may supply a voltage as the electrical control signal to the electrodes 111 and 112. The control voltage may be a DC voltage to set the resonance peak of the resonator 100 at a desired spectral location. The DC voltage may be adjusted by the control unit 130 to tune the spectral position of the transmission peak when such tuning is needed. For dynamic tuning operations, the control unit 130 adjusts the control voltage in response to a control signal to, e.g., maintain the transmission peak at a desired spectral position or frequency or to change the frequency of the transmission peak to a target position. In some other operations, the control unit 130 may adjust the control voltage in a time varying manner, e.g., scanning the transmission peak at a fixed or varying speed or constantly changing the transmission peak in a predetermined manner or to produce signal modulation. In some applications, both a modulation electrical signal and a DC electrical signal can be applied to the electrodes on the resonator 100.

For example, a Z-cut LiNbO$_3$ disk cavity with a diameter of d=4.8 mm and a thickness of 170 μm may be used as the resonator 110. The cavity perimeter edge may be prepared in the toroidal shape with a 100 μm radius of curvature. As an alternative to the strip electrodes shown in FIG. 1A, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent on the central part of the resonator and are present at the perimeter edge of the resonator where WGMs are localized.

One technical feature of such an electro-optic WGM resonator is the phase matching between the applied RF and microwave signal and the light in a WGM inside the resonator to provide efficient interaction between the light and the applied RF and microwave signal. The geometry of the electrodes on the WGM resonator can be designed to facilitate this phase matching. As an example, in a WGM optical resonator made of a material exhibiting an electro-optic effect and shaped to support one or more optical whispering gallery modes circulating along a circular optical loop near a rim of the optical resonator, electrodes can be formed on the optical resonator to apply an RF or microwave signal to the optical resonator to effectuate the electro-optic effect and, notably, the electrodes can be designed to include electrode segments located on one surface of the optical resonator connected in series along part of the circular optical loop and two adjacent electrode segments are at different radial distances from a center of the circular optical loop to cause a spatial modulation in the applied RF or microwave signal in the optical resonator to facilitate the phase matching.

This design can be used in various applications. For example, lithium niobate whispering gallery mode receiver has high sensitivity to microwave pulses. This makes it very useful as a microwave sensor for many applications. Manufacturing of such a receiver includes multileveled microwave assembling procedure which requires very experienced personnel and has low yield. Planar technologies on the other hand promise much easier and cheaper manufacturing of receiver. Narrowband microwave excitation of the receiver requires RF tune-up of the microwave resonator. This is risky time consuming part of the assembly process with low yield. It also requires very experienced operator. Broadband excitation removes these risks. The present design can be used in manufacture of on-chip specific set of broadband planar microwave components, microwave components on the resonator and to couple these two structures together by bonding.

Figure 2A:
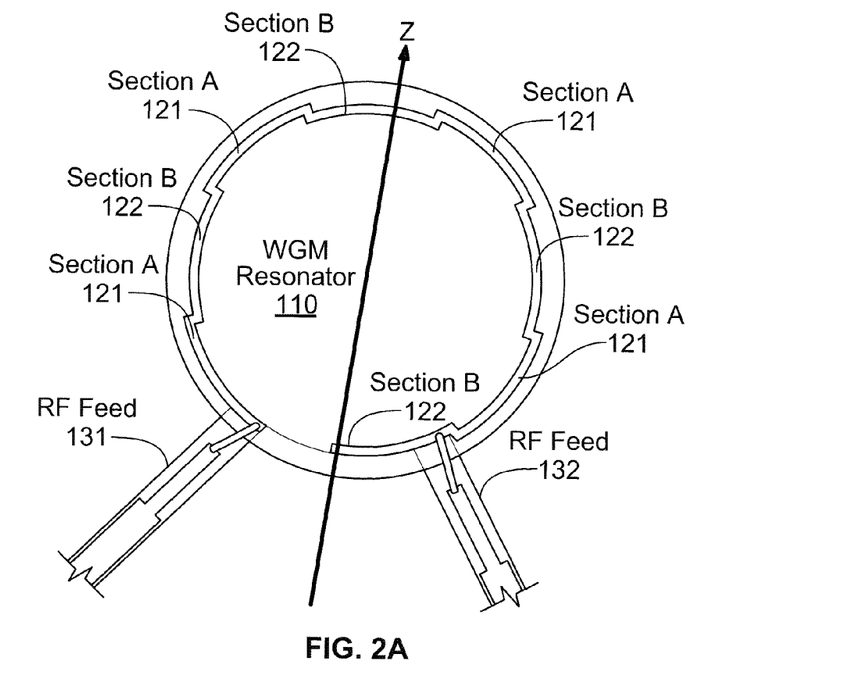
FIGS. 2A and 2B show an example of spatially modulated electrodes for a WGM resonator that can provide efficient interaction between microwave and optical fields in the WGM resonator.
Figure 2B:
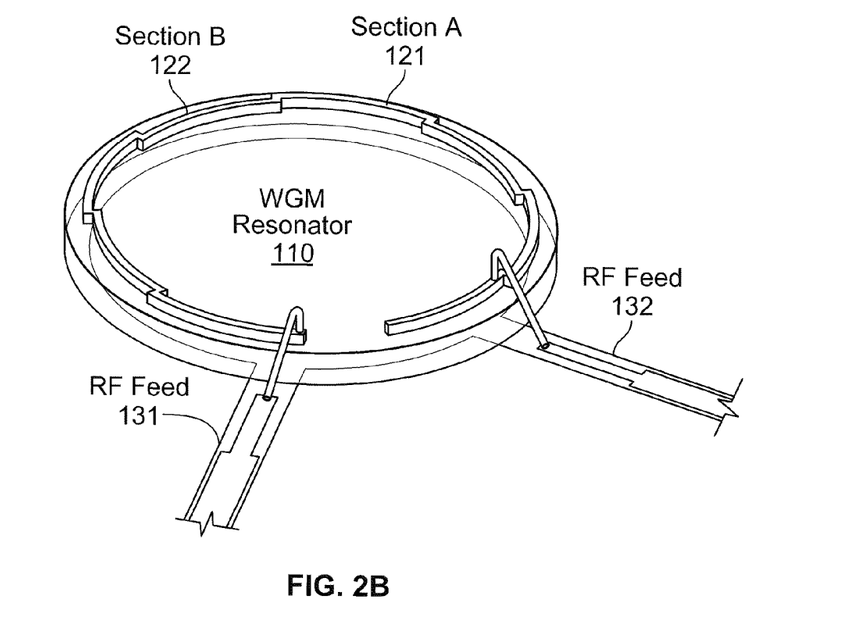

The present design of spatially modulated electrodes for WGM resonators can provide efficient interaction between microwave and optical field in the WGM resonator. FIGS. 2A and 2B show an example.

Referring to FIG. 2A, the electro-optical WGM resonator 110 includes electrode segments 122 and 121 that are spatially interleaved and connected around the circular rim of the resonator 110 to form an arc electrode structure with its two terminals connected to RF feeds 131 and 132. The distances of the electrode segments 121 and 122 are at different radial distances from a center of the circular optical loop in which the light circulates inside the resonator 110. The electrode segments 121 and 122 may have different segment lengths and different radial distances to provide a spatial modulation in the applied RF or microwave signal in the optical resonator 110 to facilitate the phase matching.

In the illustrated example, the electrode segments 121 and 122 are arc segments with an equal length which is estimated as:

$$L = \frac{\lambda_{rf}}{2(N-n)}$$

where N is refractive index of RF field in resonator, n is the refractive index of optical field of working polarization, lambda is operating RF wavelength in vacuum. The actual length of section is a result of a computer simulation. The electrode segments 121 are at one radial distance from the center of the resonator 110 and the electrode segments 122 are at a different radial distance.

Figure 2C:
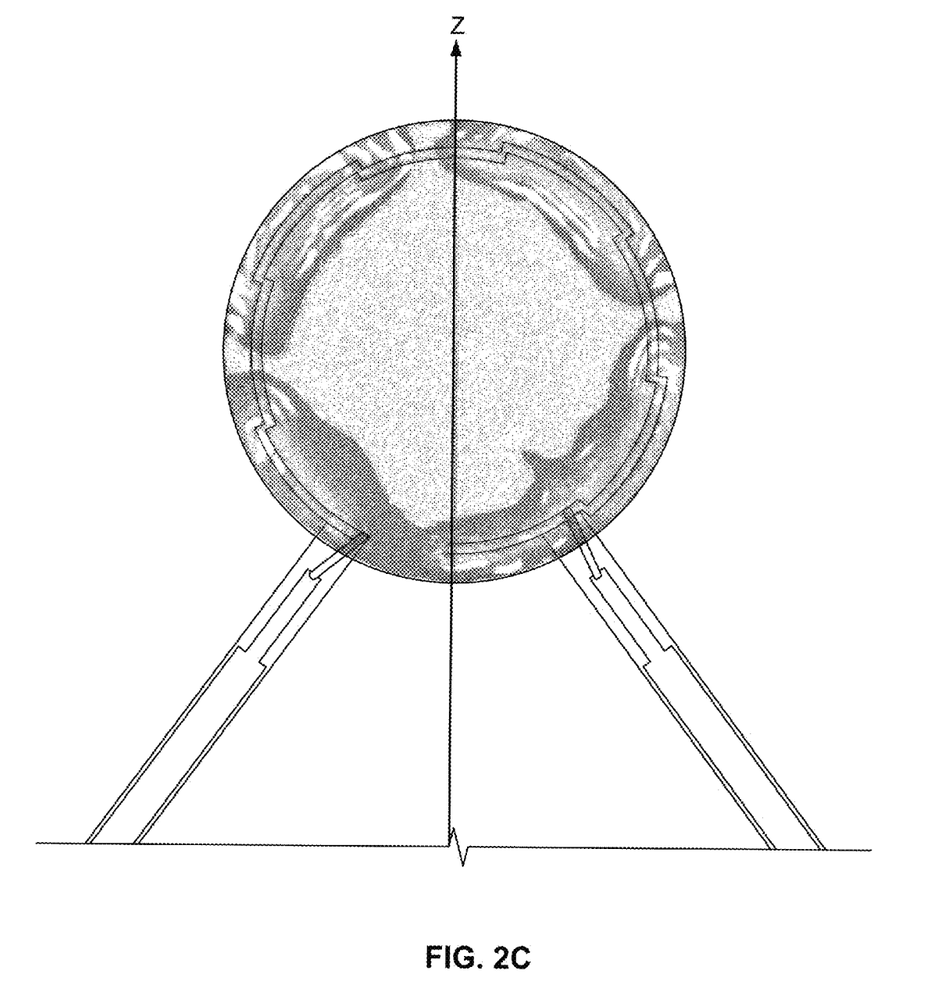
FIG. 2C shows an example of the spatial distribution of a spatially modulated RF field in a shaped waveguide on top of a whispering gallery mode resonator.

FIG. 2C shows an example of the spatial distribution of the spatially modulated RF field in a shaped waveguide on top of the whispering gallery mode resonator. The length of each section of the spatially modulated electrode determines phase matching. The RF field is color coded linearly from green to blue.

Figure 3A:
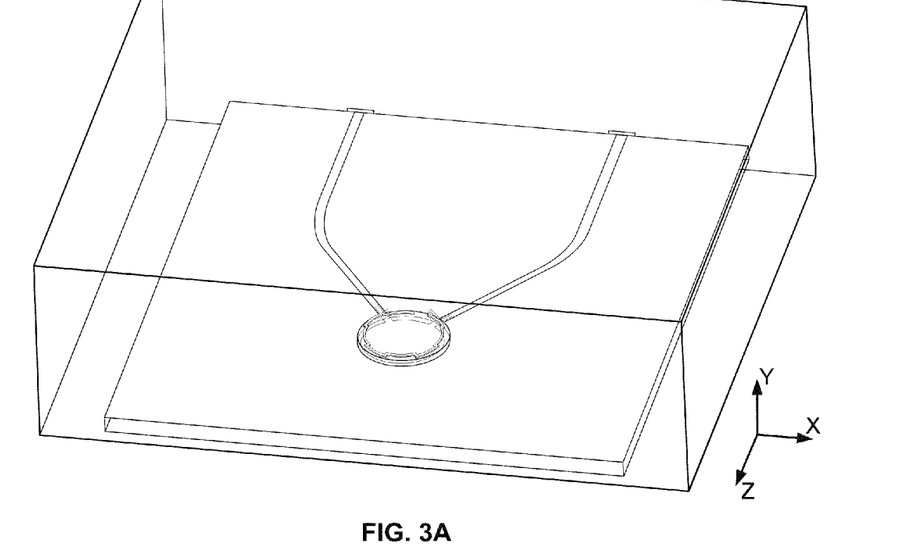
FIGS. 3A and 3B show two configurations of broadband excitation waveguides for input and output in a WGM resonator having spatially modulated electrodes.
Figure 3B:
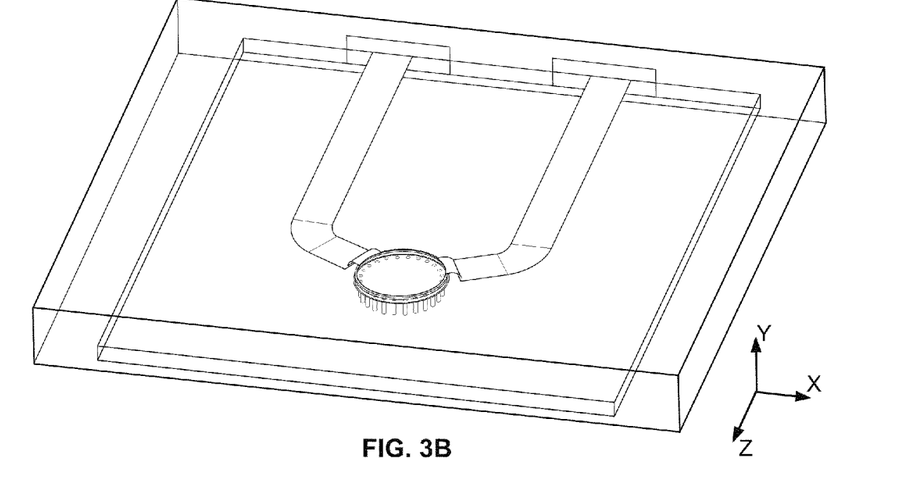

To achieve broadband excitation waveguides for input and output coupling must be impedance matched with resonator based waveguide. We propose two configurations for low and high frequencies as depicted at FIGS. 3A and 3B. Advantage of this particular approach is better manufacturability. All RF component is prepared before installation of the sensitive element—microdisk. This approach can increase the yield and reduce the cost of the assembly.

Figure 4:
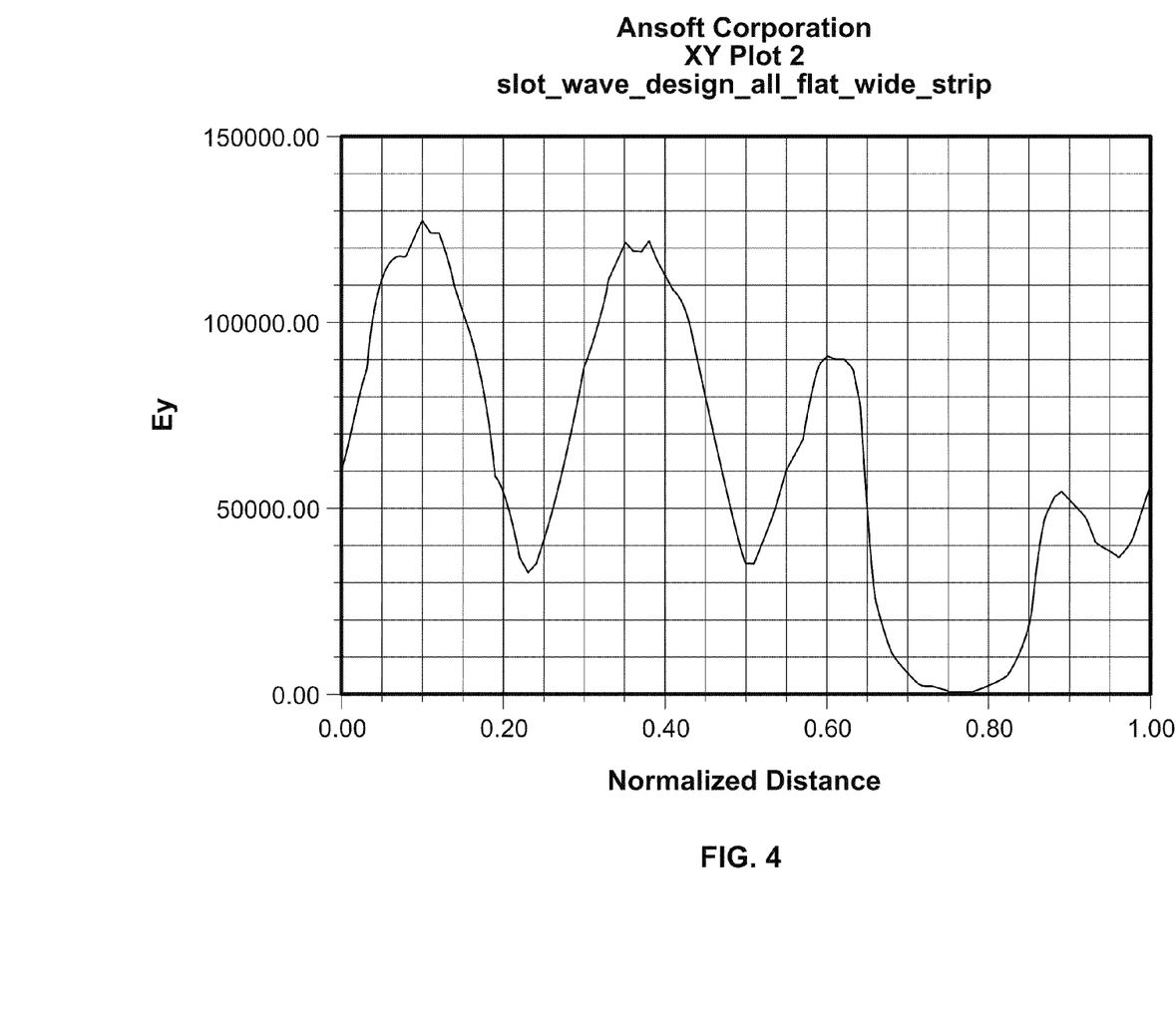
FIG. 4 shows an example of the RF field distribution in an on-chip resonator based on the spatially modulated electrodes in FIGS. 2A and 2B.

FIG. 4 shows an example of the RF field distribution in on-chip resonator. RF field at 35 GHz in this particular configuration is phase matched to optical modes of lithium niobate optical resonator.

Electro-optic WGM resonator can also be used to provide single sideband (SSB) modulation. In this regard, a method for operating a whispering gallery mode resonator device achieve SSB operation can include coupling light into an optical resonator made of a ferroelectric crystal and structured to support optical whispering gallery modes in two orthogonally polarized TE and TM modes circulating along a circular optical loop near a rim of the optical resonator; and applying an RF or microwave signal to the optical resonator in an electric field polarization oriented relative to a crystal axis of the ferroelectric crystal to effectuate coupling between light in an optical whispering gallery mode in the TE mode and light in another optical whispering gallery mode in the TM mode to produce a tunable optical single sideband modulation at a modulation frequency equal to a difference in optical frequencies of the optical whispering gallery modes in the TE and TM modes.

We demonstrate a broadly tunable and highly efficient resonant electro-optical modulator based on a whispering gallery mode resonator made with an electro optic crystal. This device is used to engineer a tunable opto-electronic oscillator.

The growing demand for more bandwidth in wireless broadband communication networks can be satisfied with the radio over fiber (RoF) technology, which allows reusing frequency bands within local wireless cells. Electro-optical modulators, high stability RF oscillators, and fast photodiodes are the key players in the game, and one of the basic challenges is the development of the high frequency elements to reduce the unwanted interference between the neighboring cells. It is expected that the local wireless cells will be operating at frequencies approaching 60 GHz, so modulators and oscillators must operate at such frequencies. A challenge of fiber based networks associated with increasing frequencies is the nonlinear and dispersive characteristics of the fiber that impact RoF links. One approach addressing these challenges is the use of single sideband modulators. Here we introduce a new class of whispering gallery mode-based single sideband modulators and oscillators that will be important in current and future applications of RoF networks. These devices are unique in that they are fundamentally single sideband, as opposed to previous realizations where cancelation schemes remove the undesired sideband. Our modulator is narrowband, yet widely tunable, in contrast to conventional wide band modulators with fixed band frequency. This property is expected to lead to new architectures for RoF applications.

Whispering gallery mode (WGM) resonators made of $LiNbO_3$ and $LiTaO_3$ have been used to create coupling between light and RF fields, achieved by engineering the shape of a micro-strip RF resonator coupled to a WGM resonator. Based on this interaction resonant electro-optic modulators (EOMs) have been developed. The modulators generally operate either at the baseband or at bands detuned from the baseband by several free spectral ranges (FSRs) of the WGM resonator. The later versions of the modulator have the highest efficiency at higher RF frequencies, but is narrowband and barely tunable, in contrast with proposed here tunable EOM.

Figure 5:
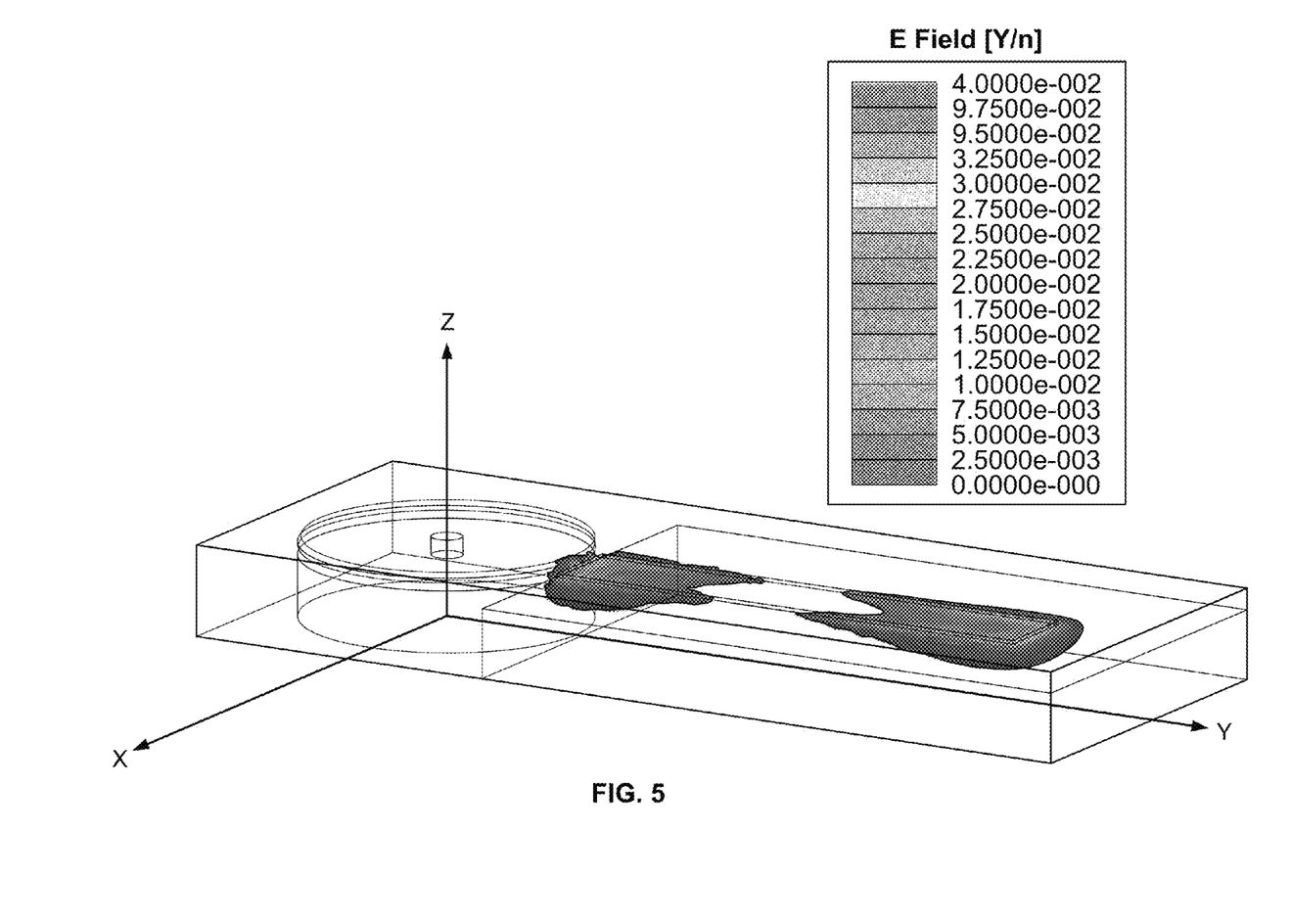
FIG. 5 shows a design where the electrode couples RF signal in a polarization that is in the plane of the optical loop in which the light is confined in a WGM.

FIG. 5 shows a design where the electrode couples RF signal in a polarization that is in the plane of the optical loop in which the light is confined in a WGM.

Figure 6:
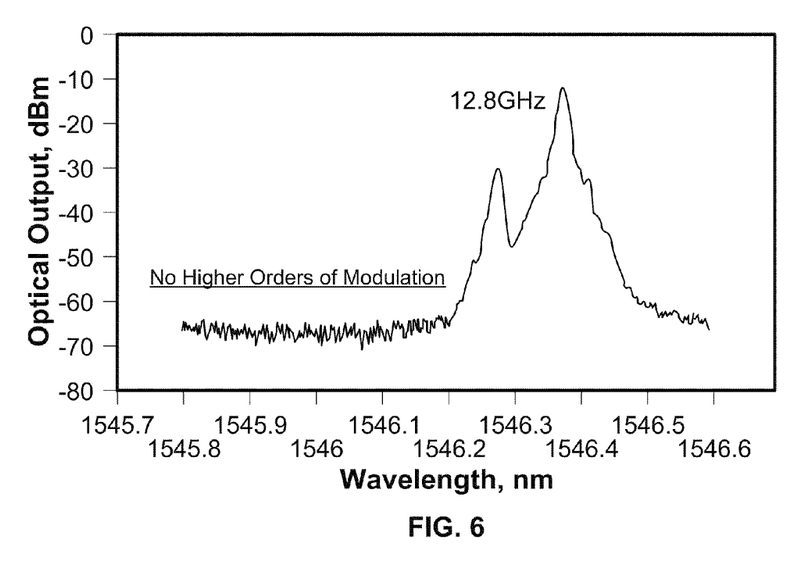
FIG. 6 and FIG. 7 show examples of single sideband modulation.
Figure 7:
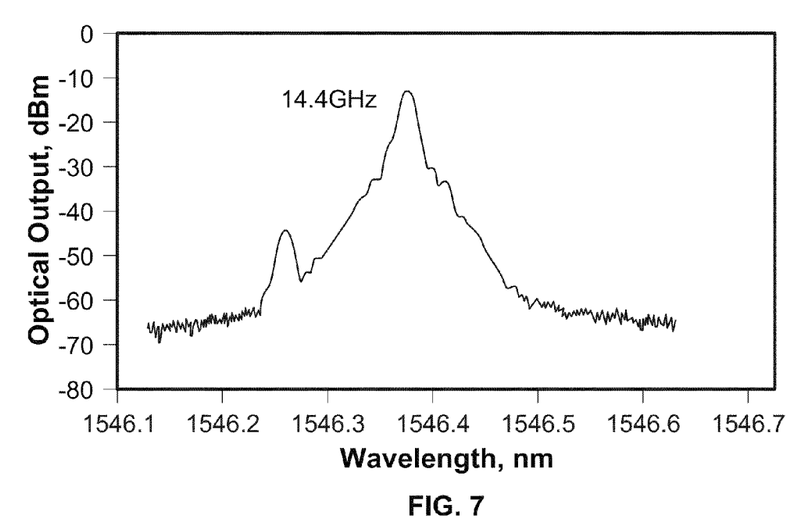

FIG. 6 and FIG. 7 show examples of single sideband modulation.

The modulation is achieved between the WGM modes separated not by the free spectral range of the resonator, but rather by some frequency given by the resonator shape, temperature, and the bias voltage. Tests were conducted to demonstrate the single sideband modulation using heterodyne technique. The modulated light was mixed with an optical local oscillator, demodulated at a fast PD, and sent to an RF spectrum analyzer. The measured value of the second sideband rejection (SSR) was about 70 dBc and was limited by the maximum sensitivity of our measurement system. Conducted tests demonstrated that the electro-optical tunability of the modulator was over 50 V span of the DC bias.

The light confined in two optical WGMs characterized with electric field operators $\vec{E}_1$ and $\vec{E}_2$ is coupled with the RF field $\vec{E}_M$ in the case of nonzero interaction energy $$E = \frac{1}{8\pi} \int_V \sum_{i,j,k} r_{ijk} D_i D_j E_{Mk} dv, \quad (1)$$

where $r_{ijk}$ describes the space dependent electro-optic non-linearity of the resonator host material, $D_i = \Sigma_l \epsilon_{il} E_l$, electric field $E_l$ is presented as a sum of two counter-propagating waves, and V is the volume of the WGM resonator. We have studied the interaction between two WGM mode families having different polarizations. Because the mode families are shifted one with respect to the other in the frequency space it is possible to realize single sideband tunable modulation in the system. The interaction is achieved due to the non-diagonal elements of the linear electro-optic tensor of the material (e.g. $r_{51}$). Those elements introduce coupling between TE and TM WGMs in a resonator fabricated from a z-cut $LiTaO_3$ preform if the RF field has a radial component so that $$E = \frac{n_e^2 n_o^2}{4\pi} \int_V r_{51}(\vec{E}_{TM} \cdot \vec{E}_{RF}) E_{TE}^* dv, \quad (2)$$

where we take into account that $\vec{E}_{TE} = \vec{z} E_{TE}$. The averaged interaction energy is generally zero because $n_e \neq n_o$. However, either periodical poling of the material or creating a special electrode shape for the RF mode phase matches the interaction such that $E \neq 0$. Finally, a composite resonator can be fabricated from, say, x-cut and z-cut cylindrical segments attached together so that the nonzero interaction again becomes possible.

We have achieved interaction of the light confined in TE and TM mode families experimentally and realized single sideband modulation in a WGM resonator having 48 GHz free spectral range. The second sideband rejection (SSR) is greater than 70 dBc. The modulation frequency is tuned from 10.5 GHz to 14.5 GHz with +50 V DC bias change, and can be readily extended to 20 GHz and beyond. Wider band thermal tunability is also demonstrated. The possibility of increasing the modulation bandwidth of the EOMs without significant efficiency deterioration is a great advantage of this technology. The RF bandwidth of our modulator is approximately 20 MHz, however it can be significantly larger (1 GHz and more) if one uses smaller WGM resonators and takes advantage of the interaction of different WGM families.

An example of an application for the tunable modulator is the tunable opto-electronic oscillator (OEO). The CEO is based on an electro-optic feedback loop that directly converts light energy to spectrally pure RF radiation. The CEO performance does not degrade with RF frequency, and an CEO operating at, say, 5 GHz has the same noise performance as one operating at 60 GHz, assuming the same amplifier noise for the two examples. This is a useful feature for the RoF applications.

Figure 8:
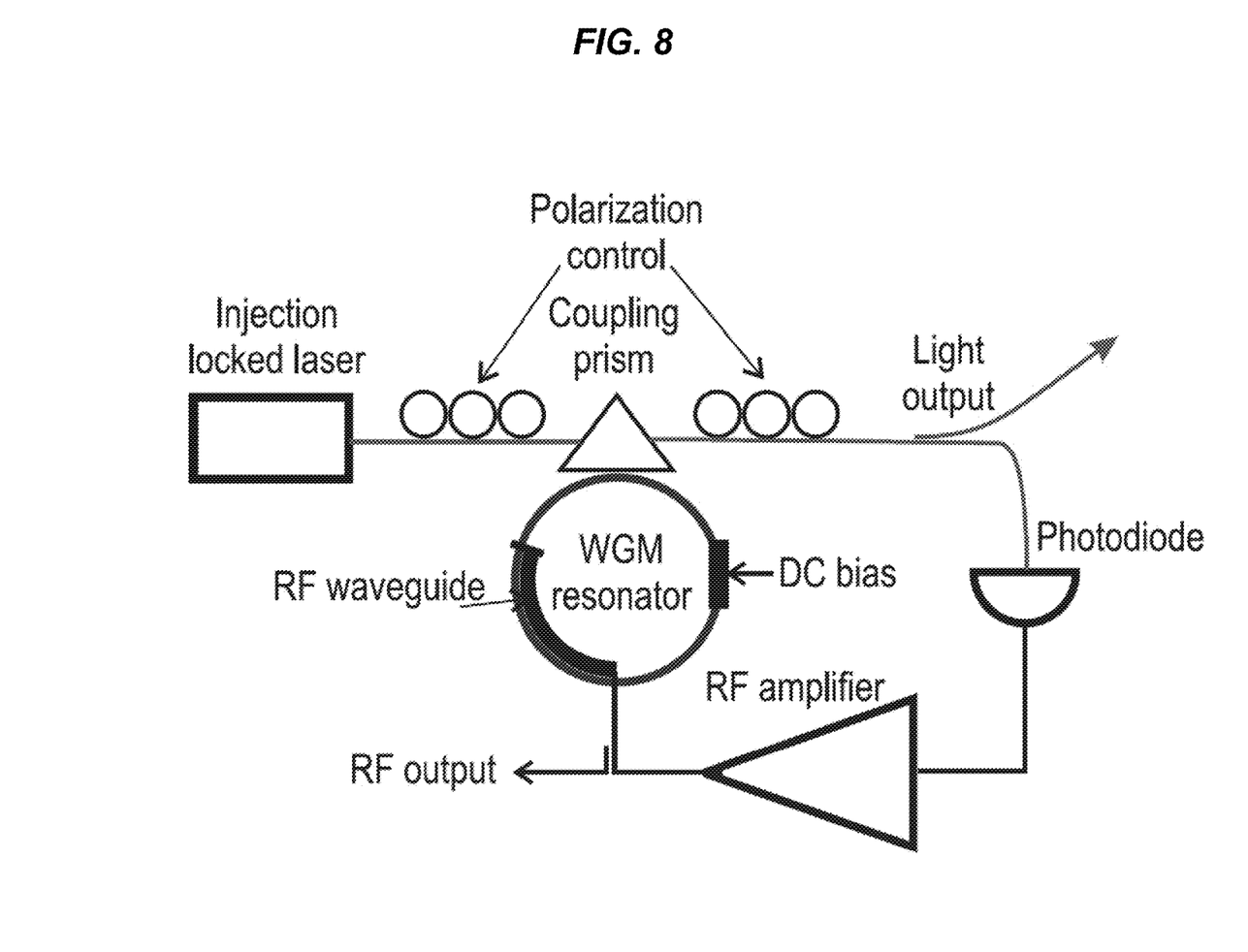
FIG. 8 shows a schematic of a tunable opto-electronic oscillator (OEO) based on single sideband modulation in an electro-optic WGM resonator.

We have studied the CEO shown in (FIG. 8). A semiconductor laser is injection locked to a lithium tantalate resonator arranged as a tunable single-sideband modulator; the output of the modulator is fed to a photodetector, which produces an electric signal that is amplified before being fed back to the modulator to complete the CEO loop. The single-sideband modulator is ideally suited for the CEO because it produces an RF signal on a photodiode with the highest possible power for a given optical power. The narrow bandwidth of the resonator provides the filter function required for the CEO loop, and the change in the mode spacing produced by the applied to the WGM resonator DC voltage bias tunes the CEO frequency. We expect that the oscillator can be tuned from 2 to 18 GHz (the demonstrated tunability currently corresponds to the tunability of our modulator. The spectral purity goal corresponds to the phase noise of −120 dBc at 10 kHz. The entire size of the packaged oscillator should not exceed an inch cubed.

FIG. 8 shows a schematic of the tunable OEO. Light is sent from the laser to the electro-optic WGM resonator (WGMR) through the polarization control device and the coupling diamond prism. The distributed feedback (DFB) [DFB] semiconductor laser is injection (self-) locked to the WGM (say, TM) due to the backward Rayleigh scattering within the resonator. The lock keeps the laser carrier frequency at the WGM even though the resonant WGM frequency drifts in time because of thermal variations. The polarization of the light entering the resonator is selected such that some light enters the TM WGM and the rest is reflected from the prism-resonator interface. In the case of the electro-optical modulation the optical sideband is generated in the selected TE mode. The light leaving this mode has the same polarization as the light reflected from the coupler. Interfering on the photodiode the light creates RF signal at the frequency coinciding with the frequency difference between the TM and TE modes. The preamplified RF signal is returned to the WGM resonator via an RF electrode. The system oscillates if the optical power as well as RF amplification is high enough. The oscillation frequency can be tuned with a DC bias applied to the WGM resonator as the bias changes the frequency difference between the TM and TE modes.

A demonstration of a tunable resonant electro-optical modulator based on a high-Q whispering gallery mode resonator made out of lithium tantalate is achieved. The demonstrated tunability range approaches 5 GHz and potentially can exceed 20 GHz. The modulation frequency is determined by the properties of the RF electrode and can potentially exceed 60 GHz. The modulation bandwidth can scale from approximately 1 MHz to 1 GHz, depending on the loading of the resonator. A compact tunable opto-electronic oscillator is one of immediate applications of the modulator.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements to the described implementations and other implementations can be made based on what is disclosed.

What is claimed is:

1. A whispering gallery mode resonator based device, comprising:
    an optical resonator made of a material exhibiting an electro-optic effect and shaped to support one or more optical whispering gallery modes circulating along a circular optical loop near a rim of the optical resonator; and
    electrodes formed on the optical resonator to apply an RF or microwave signal to the optical resonator to effectuate the electro-optic effect and comprising a plurality of electrode segments located on one surface of the optical resonator connected in series along part of the circular optical loop and, wherein two adjacent electrode segments are at different radial distances from a center of the circular optical loop to cause a spatial modulation in the applied RF or microwave signal in the optical resonator.

2. The device as in claim 1, wherein the electrode segments have a common segment length.

3. The device as in claim 2, wherein the common segment length is a length that provides a phase matching between an optical field of an optical signal in an optical whispering gallery mode of the optical resonator and the applied RF or microwave signal for efficient interaction between the optical signal and the applied RF or microwave signal.

4. The device as in claim 2, wherein the common segment length is a length determined by the wavelength of the applied RF or microwave signal, a refractive index of the material exhibiting the electro-optic effect at the wavelength of the applied RF or microwave signal, and a refractive index of the material exhibiting the electro-optic effect at the wavelength of the optical signal.

5. The device as in claim 1, wherein the material exhibiting the electro-optic effect is lithium niobate.

6. A whispering gallery mode resonator based device, comprising:
    an optical resonator made of a ferroelectric crystal and structured to support optical whispering gallery modes in two orthogonally polarized TE and TM modes circulating along a circular optical loop near a rim of the optical resonator; and
    electrodes formed on the optical resonator to apply an RF or microwave signal to the optical resonator in an electric field polarization oriented relative to a crystal axis of the ferroelectric crystal to effectuate coupling between an optical whispering gallery mode in the TE mode and another optical whispering gallery mode in the TM mode to produce an optical single sideband modulation on light in the optical resonator.

7. The device as in claim 6, wherein the electrodes formed on the optical resonator to apply the RF or microwave signal to the optical resonator in the electric field polarization that is in a plane of the circular optical loop.

8. The device as in claim 6, wherein the ferroelectric crystal is a LiNbO3 crystal.

9. The device as in claim 6, comprising:
    a laser that produce laser light;
    an optical coupler that couples the laser light into the optical resonator and couples modulated light in the optical resonator by the optical single sideband modulation out of the optical resonator to produce an optical output;
    an optical detector that receives the optical output to produce a detector output; and
    an electrical feedback circuit that receives the detector output and, in response to the received detector output, produces the RF or microwave signal that is directed to the electrodes, wherein the optical resonator, the optical detector, and the electrical feedback circuit form a closed loop to produce an oscillation.

10. The device as in claim 9, comprising:
    an optical delay element in an optical path of the optical output between the optical coupler and the optical detector.

11. The device as in claim 9, wherein the optical coupler directs light in the optical resonator back to the laser to cause injection locking between the laser and the optical resonator.

12. The device as in claim 6, comprising:
    a laser that produce laser light;
    an optical coupler that couples the laser light into the optical resonator and couples modulated light in the optical resonator by the optical single sideband modulation out of the optical resonator to produce an optical output; and an optical detector that receives the optical output to produce a detector output that carries a communication signal carried by the applied RF or microwave signal.

13. A method for operating a whispering gallery mode resonator device, comprising:

coupling light into an optical resonator made of a ferroelectric crystal and structured to support optical whispering gallery modes in two orthogonally polarized TE and TM modes circulating along a circular optical loop near a rim of the optical resonator; and applying an RF or microwave signal to the optical resonator in an electric field polarization oriented relative to a crystal axis of the ferroelectric crystal to effectuate coupling between light in an optical whispering gallery mode in the TE mode and light in another optical whispering gallery mode in the TM mode to produce a tunable optical single sideband modulation at a modulation frequency equal to a difference in optical frequencies of the optical whispering gallery modes in the TE and TM modes.

14. The method as in claim 13, comprising:

tuning a frequency of the applied RF or microwave signal to tune the optical single sideband modulation.

15. The method as in claim 13, comprising:

controlling the electric field polarization of the applied RF or microwave signal to be in a plane of the circular optical loop.

16. The method as in claim 13, comprising:

using the tunable optical single sideband modulation in the optical resonator to perform a tunable RF receiver operation to receive a signal carried in the applied RF or microwave signal.

* * * * *